United States Patent [19]
Jacobson et al.

[11] Patent Number: 5,546,558
[45] Date of Patent: Aug. 13, 1996

[54] MEMORY SYSTEM WITH HIERARCHIC DISK ARRAY AND MEMORY MAP STORE FOR PERSISTENT STORAGE OF VIRTUAL MAPPING INFORMATION

[75] Inventors: Michael B. Jacobson; Douglas L. Voigt; Marvin D. Nelson, all of Boise; Theresa A. Burkes, Meridian, all of Id.

[73] Assignee: Hewlett-Packard Company, Palo Alto, Calif.

[21] Appl. No.: 253,442

[22] Filed: Jun. 7, 1994

[51] Int. Cl.$^6$ .................................................. G06F 13/10
[52] U.S. Cl. ........................ 395/441; 364/246.3; 364/246; 364/264.5; 364/DIG. 1
[58] Field of Search ................................ 395/4–25, 800, 395/441

[56] References Cited

U.S. PATENT DOCUMENTS

| | | | |
|---|---|---|---|
| 5,155,835 | 10/1992 | Belsan | 395/425 |
| 5,210,860 | 5/1993 | Pfeffer | 395/575 |
| 5,301,297 | 4/1994 | Menon | 395/425 |
| 5,345,565 | 9/1994 | Jibbe | 395/325 |
| 5,390,327 | 2/1995 | Lubbers | 395/575 |
| 5,392,244 | 2/1995 | Jacobson | 365/200 |
| 5,394,532 | 2/1995 | Belsan | 395/441 |
| 5,408,644 | 4/1995 | Schneider | 395/575 |
| 5,410,667 | 4/1995 | Belsan | 395/441 |
| 5,490,248 | 2/1996 | Dan | 395/182.04 |

*Primary Examiner*—Eric Coleman

[57] ABSTRACT

A data memory system has a hierarchic disk array of multiple disks, a disk array controller for coordinating data transfer to and from the disks, and a RAID management system for mapping two different RAID areas onto the disks. The RAID management system stores data in one of the RAID areas according to mirror redundancy, and stores data in the other RAID area according to parity redundancy. The RAID management system then shifts or migrates data between the mirror and parity RAID areas on the disks in accordance with a predefined performance protocol, such as data access recency or access frequency. The data memory system also includes a memory map store embodied as a non-volatile RAM. The memory map store provides persistent storage of the virtual mapping information used by the RAID management system to map the first and second RAID areas onto the disks within the disk array. The RAID management system updates the memory map store with new mapping information each time data is migrated between mirror and parity RAID areas.

13 Claims, 3 Drawing Sheets

|  | DISKS | | | STRIPE NUMBER |
|---|---|---|---|---|
| 0 | 1 | 2 | 3 | |
| 0 | 0' | 1 | 1' | 0 |
| 2 | 2' | 3 | 3' | 1 |
| 4 | 4' | 5 | 5' | 2 |
| 6 | 6' | 7 | 7' | 3 |
| * | * | * | * | * |
| * | * | * | * | * |
| * | * | * | * | * |
| T−1 | T−1' | T | T' | S |

FIG. 2

|  | DISKS | | | STRIPE NUMBER |
|---|---|---|---|---|
| 0 | 1 | 2 | 3 | |
| 0 | 1 | 2 | P | 0 |
| 3 | 4 | P | 5 | 1 |
| 6 | P | 7 | 8 | 2 |
| P | 9 | 10 | 11 | 3 |
| * | * | * | * | * |
| * | * | * | * | * |
| * | * | * | * | * |
| P | R−2 | R−1 | R | Q |

FIG. 3

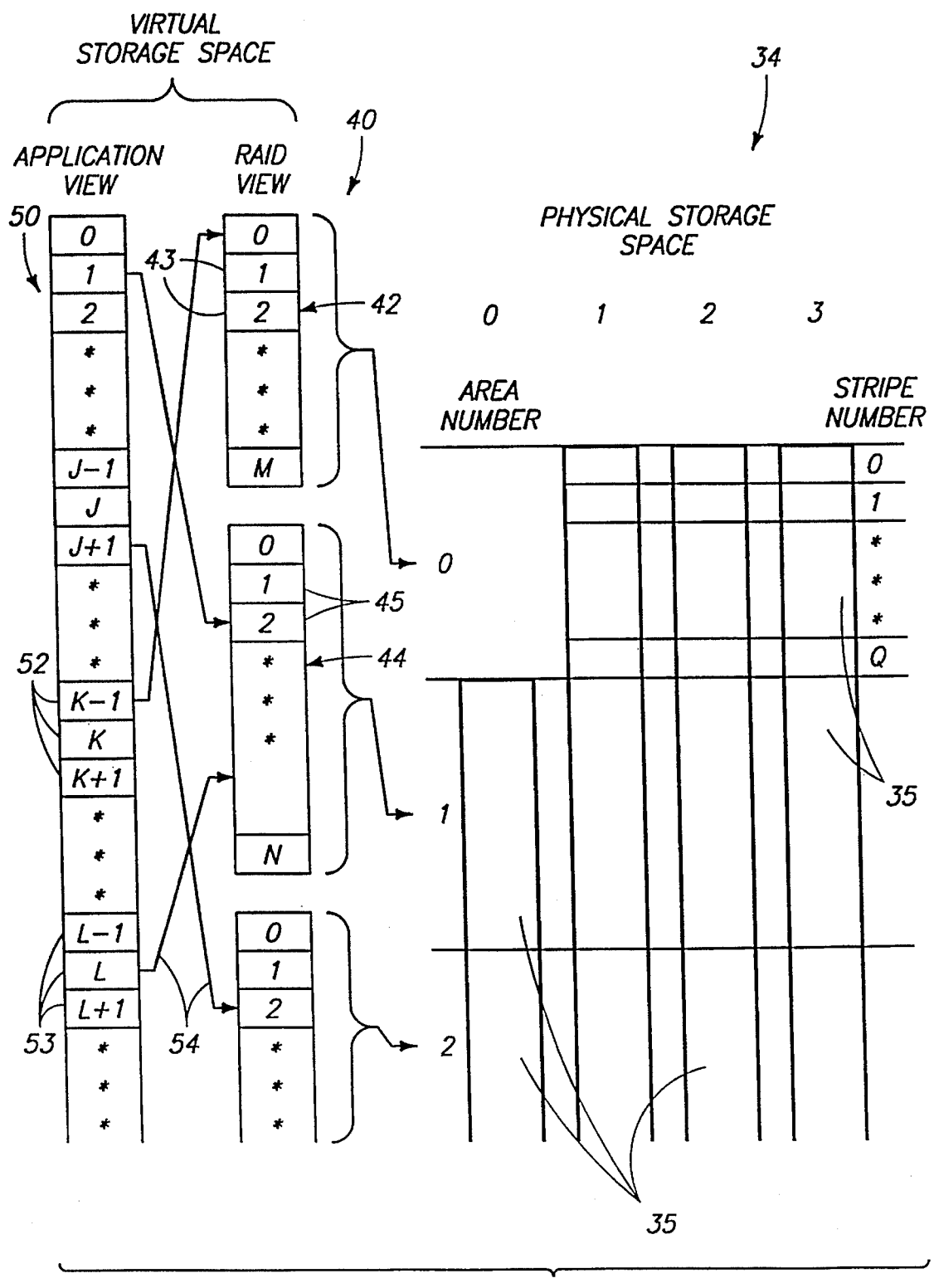

MEMORY SYSTEM WITH HIERARCHIC DISK ARRAY AND MEMORY MAP STORE FOR PERSISTENT STORAGE OF VIRTUAL MAPPING INFORMATION

FIELD OF THE INVENTION

This invention relates to non-volatile memory systems, such as computer disk arrays, having data storage redundancy management.

BACKGROUND OF THE INVENTION

Computer systems are constantly improving in terms of speed, reliability, and processing capability. As a result, computers are able to handle more complex and sophisticated applications. However, as computers improve, performance demands placed on mass storage and input/output (I/O) devices increase. In general, I/O performance has had difficulty keeping pace with the growing capabilities of the computers.

The mass storage industry faces two primary challenges: (1) to improve I/O performance so that data access does not become a limiting factor for an application, and (2) to provide access to on-line data at levels of reliability well in excess of the expected lifetimes of the computer systems that process it. See, *The RAIDBook: A Source Book for RAID Technology*, published Jun. 9, 1993, by the RAID Advisory Board, Lino Lakes, Minn. It is desirable that storage devices meet these goals in a cost-effective manner.

There are three primary design criteria for mass storage systems: cost, performance, and availability. It is most desirable to produce memory devices that have a low cost per megabyte, a high input/output performance, and high data availability. "Availability" is the ability to recover data stored in the storage system even though some of the data has become inaccessible due to failure or some other reason and the ability to insure continued operation in the event of such failure. Typically, data availability is provided through the use of redundancy wherein data, or relationships among data, are stored in multiple locations.

There are two common methods of storing redundant data. According to the first or "mirror" method, data is duplicated and stored in two separate areas of the storage system. For example, in a disk array, the identical data is provided on two separate disks in the disk array. The mirror method has the advantages of high performance and high data availability due to the duplex storing technique. However, the mirror method is also relatively expensive as it effectively doubles the cost of storing data.

In the second or "parity" method, a portion of the storage area is used to store redundant data, but the size of the redundant storage area is less than the remaining storage space used to store the original data. For example, in a disk array having five disks, four disks might be used to store data with the fifth disk being dedicated to storing redundant data. The parity method is advantageous because it is less costly than the mirror method, but it also has lower performance and availability characteristics in comparison to the mirror method.

The present invention provides a memory system which achieves the three desired attributes of high performance, high data availability, and low cost.

SUMMARY OF THE INVENTION

The memory system of this invention includes a hierarchic disk array of multiple disks and a disk array controller coupled to the disk array for coordinating data transfer to and from the disks. The memory system maps one or more virtual storage spaces onto the physical storage space of a disk array according to redundancy or RAID level criteria. Data to be stored according to one type of redundancy (such as mirror redundancy or RAID Level 1) is placed in one area of the virtual storage space and data to be stored according to another type or redundancy (such as parity redundancy or RAID Level 5) is placed in another area of the virtual storage space.

A RAID (Redundant Array of Independent Disks) management system is operatively coupled to the disk array controller for mapping the virtual storage space characterized as different RAID areas onto the disks. The RAID management system stores data in a first RAID area according to a first RAID level (such as RAID level 1 or mirror redundancy) and stores data in the second RAID area according to a second RAID level (such as RAID level 5 or parity redundancy). The RAID management system shifts or migrates data between the first and second RAID areas on the disks in accordance with a defined performance protocol.

An updatable memory map store in the form of a non-volatile RAM is provided in the disk array controller and external to the disk array. The memory map store provides persistent storage of the virtual mapping information used by the RAID management system to map the first and second RAID areas onto the disks. The RAID management system dynamically alters the mapping of the first and second RAID areas on the disks and updates the mapping information in the memory map store to reflect the alteration.

DESCRIPTION OF THE DRAWINGS

Preferred embodiments of the invention are described below with reference to the following accompanying drawings depicting examples embodying the best mode for practicing the invention.

FIG. 2 is a diagrammatic illustration showing a RAID Level 1 data storage

FIG. 3 is a diagrammatic illustration showing a RAID Level 5 data storage.

FIG. 4 is a diagrammatic illustration of a memory mapping arrangement of this invention where two virtual storage spaces are mapped onto a physical storage space.

DETAILED DESCRIPTION OF THE INVENTION

Figure 1:
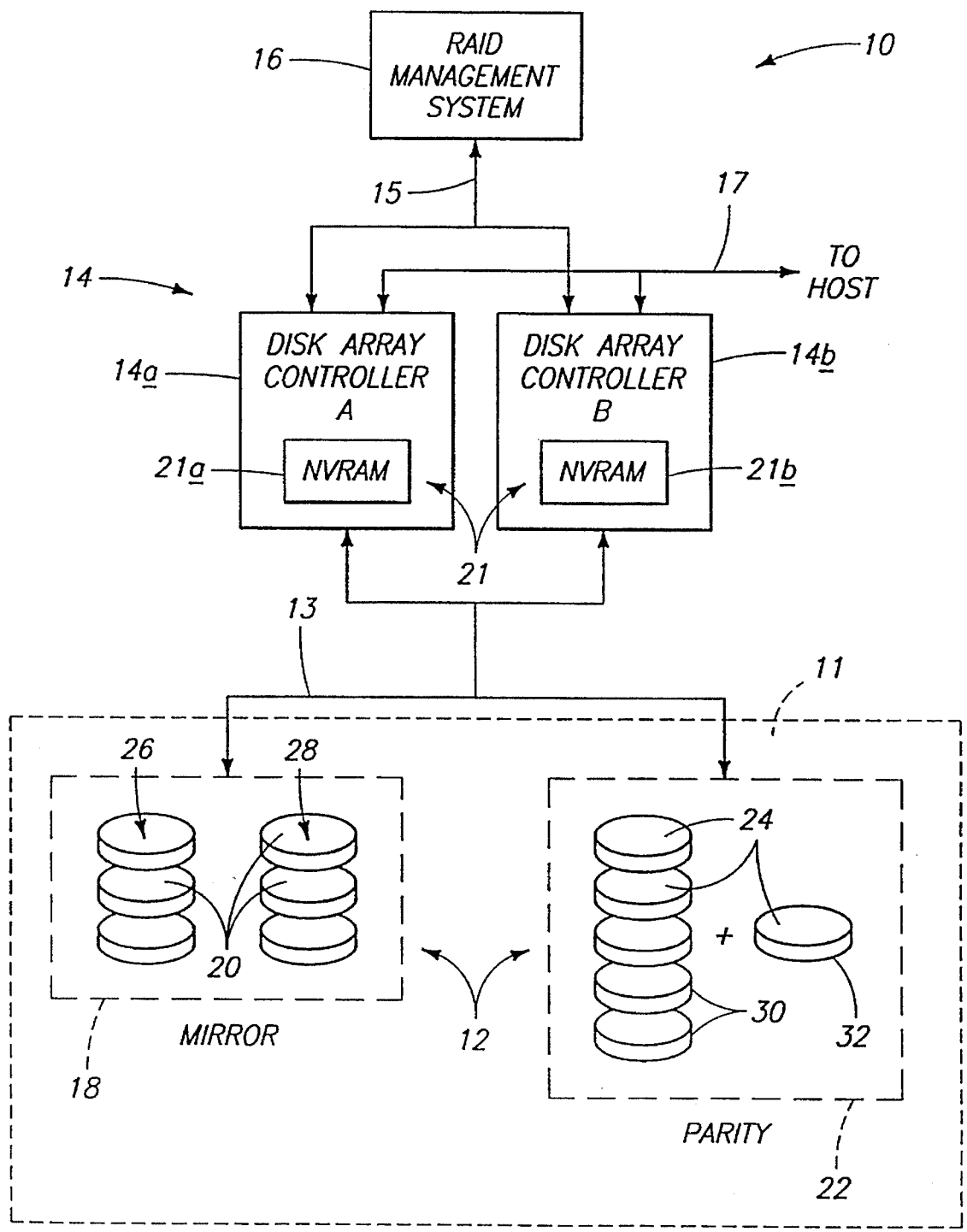
FIG. 1 is a diagrammatic block diagram of a memory system according to this invention.

This disclosure of the invention is submitted in furtherance of the constitutional purposes of the U.S. Patent Laws "to promote the progress of science and useful arts". U.S. Constitution, Article 1, Section 8.

FIG. 1 shows a data memory system 10 constructed according to this invention. Preferably, memory system 10 includes a hierarchic disk array 11 having a plurality of disks 12, a disk array controller 14 coupled to the disk array 11 to coordinate data transfer to and from the disks 12, and a RAID management system 16.

For purposes of this disclosure, a "disk" is any non-volatile, randomly accessible, rewritable mass storage device which has the ability of detecting its own storage failures. It includes both rotating magnetic and optical disks and solid-state disks, or non-volatile electronic storage elements (such as PROMs, EPROMs, and EEPROMs). The term "disk array" is a collection of disks, the hardware required to connect them to one or more host computers, and management software used to control the operation of the physical disks and present them as one or more virtual disks to the host operating environment. A "virtual disk" is an abstract entity realized in the disk array by the management software.

The term "RAID" (Redundant Array of Independent Disks) means a disk array in which part of the physical storage capacity is used to store redundant information about user data stored on the remainder of the storage capacity. The redundant information enables regeneration of user data in the event that one of the array's member disks or the access path to it fails. A more detailed discussion of RAID systems is found in a book entitled, *The RAIDBook: A Source Book for RAID Technology*, published Jun. 9, 1993, by the RAID Advisory Board, Lino Lakes, Minn.

Disk array controller 14 is coupled to disk array 11 via one or more interface buses 13, such as a small computer system interface (SCSI). RAID management system 16 is operatively coupled to disk array controller 14 via an interface protocol 15. Data memory system 10 is also coupled to a host computer (not shown) via an I/O interface bus 17. RAID management system 16 can be embodied as a separate component, or configured within disk array controller 14, or within the host computer. RAID management system 16 provides a manager means for controlling disk storage and reliability levels, and for transferring data among various reliability storage levels. These reliability storage levels are preferably mirror or parity redundancy levels as described below, but can also include a reliability storage level with no redundancy at all.

The disk array controller 14 is preferably implemented as a dual controller consisting of disk array controller A 14a and disk array controller B 14b. The dual controllers 14a and 14b enhance reliability by providing continuous backup and redundancy in the event that one controller becomes inoperable.

The hierarchic disk array 11 can be characterizable as different storage spaces, including its physical storage space and one or more virtual storage spaces. These various views of storage are related through mapping techniques. For example, the physical storage space of the disk array can be mapped into a virtual storage space which delineates storage areas according to the various data reliability levels. Some areas within the virtual storage space can be allocated for a first reliability storage level, such as mirror or RAID level 1, and other areas can be allocated for a second reliability storage level, such as parity or RAID level 5. The various mapping techniques and virtual spaces concerning RAID levels are described below in more detail.

Memory system 10 includes a memory map store 21 that provides for persistent storage of the virtual mapping information used to map different storage spaces onto one another. The memory map store 21 is external to the disk array, and preferably resident in the disk array controller 14. The memory mapping information can be continually or periodically updated by the controller or RAID management system as the various mapping configurations among the different views change.

Preferably, memory map store 21 is embodied as two non-volatile RAM (Random Access Memory) 21a and 21b which are located in respective controllers 14a and 14b. An example non-volatile RAM (NVRAM) is a battery-backed RAM. A battery-backed RAM uses energy from an independent battery source to maintain the data in the memory for a period of time in the event of power loss to the memory system 10. One preferred construction is a self-refreshing, battery-backed DRAM (Dynamic RAM).

The memory map store 21 can also be configured to redundantly store the memory mapping information according to a selected reliability level. In the preferred construction, the dual NVRAMs 21a and 21b provide for redundant storage of the memory mapping information. The virtual mapping information is duplicated and stored in both NVRAMs 21a and 21b according to mirror redundancy techniques. In this manner, NVRAM 21a can be dedicated to storing the original mapping information and NVRAM 21b can be dedicated to storing the redundant mapping information. In an alternative construction, a mirrored memory map store can be configured using a single non-volatile RAM with sufficient space to store the data in duplicate.

The memory system of this invention is advantageous over prior art designs because it employs a persistent, non-volatile memory map store which is separate from the disk array. In prior art systems that utilize virtual mappings, persistent storage of the mapping information was kept on the storage disks themselves. However, the procedures for maintaining the consistency of the mapping information through unexpected interruptions, such as unplanned power loss, and the access characteristics of the devices themselves lead to performance loss in access to the mapped data.

This memory system 10 overcomes these drawbacks by providing for the persistent storage of virtual mappings in the non-volatile RAM store 21. This unique arrangement improves performance in access to mapped data in two ways. First, less elaborate procedures can be used to maintain mapping consistency. Second, RAM devices have higher performance access characteristics in comparison to magnetic storage devices. Additionally, through the use of redundant storage in the non-volatile RAM, the reliability of the mapping information is increased so that such information is at least as reliable as the user data stored on the disk array.

As shown in FIG. 1, disk array 11 can be conceptualized as being arranged in a mirror group 18 of multiple disks 20 and a parity group 22 of multiple disks 24. Mirror group 18 represents a first memory location or RAID area of the disk array which stores data according to a first or mirror redundancy level. This mirror redundancy level is also considered a RAID Level 1. RAID Level 1, or disk mirroring, offers the highest data reliability by providing one-to-one protection in that every bit of data is duplicated and stored within the memory system. The mirror redundancy is diagrammatically represented by the three pairs of disks 20 in FIG. 1. Original data can be stored on a first set of disks 26 while duplicative, redundant data is stored on the paired second set of disks 28.

FIG. 2 illustrates the storage of data according to RAID Level 1 in more detail. The vertical columns represent individual disks, of which disks 0, 1, 2, and 3 are illustrated. Horizontal rows represent "stripes" in which data is distributed across the disks in the array. A stripe is comprised of numerous segments, with one segment being associated with each disk. In this example, data stored on disk 0 in segment 0 of stripe 0 is duplicated and stored on disk 1 in segment 0' of stripe 0. Similarly, data stored on disk 2 in segment 5 of stripe 2 is mirrored into segment 5' of stripe 2 on disk 3. In this manner, each piece of data is duplicated and stored on the disks. The redundancy layout of FIG. 2 is provided for explanation purposes. The redundant data need not be placed neatly in the same stripe as is shown. For example, data stored on disk 0 in segment 2 of stripe 1 could be duplicated and placed on disk 3 in segment T' of stripe S.

With reference again to FIG. 1, the parity group 22 of disks 24 represent a second memory location or RAID area in which data is stored according to a second redundancy level, such as RAID Level 5. In this explanatory illustration, original data is stored on the five disks 30 and redundant "parity" data is stored on the sixth disk 32.

FIG. 3 shows a parity RAID area layout in more detail. The parity RAID area also comprises multiple disks and a number of equal sized stripes similar to the layout described above with reference to the mirror RAID area of FIG. 2. The portion of a stripe that resides on a single disk is a segment. In this example, data is stored according to RAID Level 5 and the redundant data stored in the segments is referenced by letter P. The redundant P segments store the parity of the other segments in the stripe. For example, in stripe 0, the redundant P segment on disk 3 stores the parity of disks 0, 1, and 2. The parity for each stripe is computed with an exclusive OR function, which is represented by the symbol "⊕". The parities for the first four stripes (with the subscript numeral representing the corresponding stripe) are as follows:

$$P_0 = \text{Segment 0} \oplus \text{Segment 1} \oplus \text{Segment 2}$$
$$= \text{Disk 0} \oplus \text{Disk 1} \oplus \text{Disk 2}$$
$$P_1 = \text{Segment 3} \oplus \text{Segment 4} \oplus \text{Segment 5}$$
$$= \text{Disk 0} \oplus \text{Disk 1} \oplus \text{Disk 3}$$
$$P_2 = \text{Segment 6} \oplus \text{Segment 7} \oplus \text{Segment 8}$$
$$= \text{Disk 0} \oplus \text{Disk 2} \oplus \text{Disk 3}$$
$$P_3 = \text{Segment 9} \oplus \text{Segment 10} \oplus \text{Segment 11}$$
$$= \text{Disk 1} \oplus \text{Disk 2} \oplus \text{Disk 3}$$

Parity redundancy allows regeneration of data which becomes unavailable on one of the disks. For example, if the data in segment 5 becomes unavailable, its contents can be ascertained from segments 3 and 4 and the parity data in segment P. Parity storage is less expensive than mirror storage, but is also less reliable and has a lower performance.

The disk arrangement of FIG. 1 is provided for conceptual purposes. In practice, the disk array 11 would simply have a plurality of disks 12 which are capable of storing data according to mirror and parity redundancy. Among the available storage space provided by all disks 12, a portion of that storage space would be allocated for mirror redundancy and another portion would be allocated for parity redundancy. Preferably, disks 12 are configured to contain plural, equal sized storage regions (referenced as numeral 35 in FIG. 4), wherein individual regions have multiple segments. This feature is discussed below in more detail with reference to FIG. 4.

The novel memory system 10 of this invention manages the "migration" of data between mirror and parity storage schemes. The management of both types of redundancy is coordinated by RAID management system 16 (FIG. 1). RAID management system 16 manages the two different types of RAID areas in the disk array as a memory hierarchy with the mirror RAID areas acting similar to a cache for the parity RAID areas. Once data is moved from a parity RAID area to a mirror RAID area, the space it once occupied in the parity RAID area is available for storage of other data. The RAID management system 16 shifts, organizes, and otherwise manages the data between the mirror and parity RAID areas in accordance with a defined performance protocol.

The process of moving data between the mirror and parity RAID areas is referred to as "migration".

Memory system 10 places the more critical data in the mirror RAID areas since this affords the highest performance and reliability. The performance protocols implemented by RAID management system 16 includes one of two preferred migration policies. According to the first migration policy, the most frequently accessed data on the hierarchic disk array is maintained in the mirror RAID area 18. Less frequently accessed data is maintained in the parity RAID area 22. According to a second migration policy, known as "access recency", the most recently retrieved data is maintained in the mirror RAID area 18 while the remaining data is stored in parity RAID area 22. Other performance protocols may be employed. Ideally, such protocols are defined based upon the specific computer application and the needs of the user.

In this manner, the RAID management system 16 effectively "tunes" the storage resources of a memory system according to the application or user requirements. For instance, in an application requiring high performance and reliability, the RAID management system may create and define a proportionally larger mirror RAID area, thereby dedicating a larger amount of physical storage capacity to mirror redundancy, in comparison to the parity RAID area. Conversely, in an application where cost is premium and less importance is placed on performance or reliability, the RAID management system may establish a proportionally larger parity RAID area in comparison to the mirror RAID area. Accordingly, the memory system of this invention affords maximum flexibility and adaptation.

FIG. 4 illustrates a memory mapping of the available storage space of memory system 10 as multiple tiers of mapped virtual storage space. Each vertically elongated rectangle in the diagram represents a view of the physical storage space. In this diagram, physical storage space 34 is referenced by two virtual storage views 40 and 50. Physical storage space 34 is represented by four disks (such as disks 12 in FIG. 1) referenced by numerals 0, 1, 2, and 3. The four rectangles associated with the disks represent a view of the physical storage space wherein disks 1, 2, and 3 have approximately equal storage capacity, and disk 0 has slightly less storage capacity. The storage space 34 is partitioned into areas 0, 1, 2, etc. Individual areas contain multiple regions 35, which are preferably equal in size across the entire disk array.

The storage space of the disks can be mapped into a first or intermediate virtual view 40 of the physical storage space 34. This first virtual view is conceptually a set of RAID areas which, when viewed by the user or application program, represents one large storage space indicative of the total storage space on the disks 0, 1, 2, and 3. Accordingly, the height of the rectangle in the RAID areas is shown as higher than those of the disks.

The RAID area storage space 40 is the view of storage that identifies mirror and parity storage space. For instance, a RAID area 42 may represent a mirror RAID area of M blocks 43 while RAID area 44 represents a parity RAID area of N blocks 45. These RAID areas relate to corresponding areas 0, 1, 2, etc., on the physical storage space 34. The mirror and parity RAID areas may or may not consume the entire storage space 34 of the disk array. Accordingly, during certain applications, there may be unused and undesignated storage space that does not correspond to a particular RAID level area. However, such storage space can be converted into a mirror or parity RAID area as is described below in more detail.

The storage space available in the RAID areas can also be mapped into a second or front end virtual view 50 which is a view of storage presented to the user or application program. When viewed by the user or application program, second virtual view 50 also represents a single large storage capacity indicative of the available storage space on disk 12. Virtual storage space 50 presents a view of a linear set of equal sized storage blocks 52 and 53, referenced individually as 0, 1, 2 ... J–1, J, J+1 ... etc. The virtual block storage space 50 is represented by a table of references or pointers to storage blocks in the view presented by RAID areas 40 (as represented by arrows 54). There are at least two RAID areas that can be referenced from the virtual block table so that both mirror and parity storage areas are available. Preferably, the storage capacity of RAID areas 40 is divided into blocks of the same size as those of the virtual block view of storage space.

The RAID management system 16 can dynamically alter the configuration of the RAID areas. The RAID areas may be enlarged or shrunk depending upon the data reliability needs at a particular time. As a result, the mapping of the RAID areas in the first virtual view 40 onto the disks and the mapping of the front end virtual view 50 to RAID view 40 are generally in a state of change. Memory map store 21 maintains the current mapping information used by RAID management system 16 to map the RAID areas onto the disks, as well as the information employed to map between the two virtual views. As the RAID management system dynamically alters the RAID level mappings, it also updates the mapping information in the memory map store 21 to reflect the alterations.

The size of NVRAMs 21a and 21b embodying the memory map store 21 must be sufficient to maintain all mapping information coordinating the physical storage space 34 and the two virtual storage spaces. 40 and 50. According to an aspect of this invention, there exists a relationship between the memory capacity of the disk array ($DA_{cap}$) and the memory capacity of the memory map store ($MMS_{cap}$). This relationship is as follows:

$$MMS_{cap} \text{ (Kilobytes)} = C \times DA_{cap} \text{ (Gigabytes)}$$

where C is a constant in a range of approximately 70 to 90. Most preferably, the constant C has a value of 80.

The operation of memory system 10 will now be described with reference to FIGS. 1 and 4.

For purposes of continuing explanation, virtual blocks 53 of the second virtual storage space 50 reference associated blocks 45 in parity RAID area 44 stored in area 1 of physical storage space 34. Such virtual blocks 53 are referred to as "parity virtual blocks". Similarly, virtual blocks 52 reference associated blocks 43 in mirror RAID area 42 stored in area 0 of physical storage space 34. Such virtual blocks 52 are referred to herein as "mirror virtual blocks".

In general, to migrate data from one RAID area to another, a first virtual block 52 representing a first RAID level (such as mirror or Level 1) is selected. Then, a second virtual block 53 representing a second RAID level (such as parity or Levels 3, 4, or 5) is located. This second virtual block is preferably unused, but if an unused block cannot be located, one is created. Data is next transferred from the first virtual block to the second virtual block which causes the data to undergo a redundancy level change. For example, data once stored according to mirror redundancy would now be stored according to parity redundancy. As a final step, the second virtual storage space 50 is modified and updated to reflect the shift of data. Any mapping change occurring during this transaction would be updated in memory map store 21.

The continuing discussion provides a more detailed explanation of migrating data between mirror and parity storage areas according to preferred methods and sequences of this invention. To migrate data from a virtual block 53 indicative of a parity RAID area 44 to a virtual block 52 indicative of a mirror RAID area 42, the following sequence is employed:

1. A request is made for a virtual block 53 that is currently stored in a parity RAID area 44.
2. The RAID management system locates an unused virtual block 52 in a mirror RAID area 42.
3. If none can be found, the RAID management system creates a mirror virtual block (discussed below).
4. The RAID management system suspends new storage requests to the virtual block to be migrated.
5. The RAID management system waits until all active data storage requests to the virtual block are completed.
6. The data from the parity virtual block 53 is read into a temporary memory buffer.
7. The data is then written to the mirror virtual block 52 chosen in step 2.
8. The virtual block table is modified to reference the new virtual block location.
9. The suspended storage requests are resumed. According to the above procedure, data has moved in the second virtual view from parity virtual block(s) 53 to mirror virtual block(s) 52. Relative to the intermediate virtual view, data has moved from parity RAID area 44 to mirror RAID area 42. In physical storage space, data has migrated from area 1 to area 0.

The RAID management system 16 reserves a space equivalent to a few RAID areas for the purpose of migration. The reserved space is not available for the storage of client application, but serves as temporary storage locations for data being moved between the mirror and parity storage areas. The reserved space is useful during the creation of new RAID storage areas or the conversion between mirror and parity RAID areas during the migration process. The space can be contiguous on the disks or spread out in a non-contiguous manner over various different disks.

If an unused mirror virtual block cannot be located (Step 3 above), the RAID management system will attempt to create one according to the following preferred sequence of techniques. First, the RAID management system will attempt to locate an unused and undesignated RAID area that can be converted to a mirror RAID area. Second, if this proves unsuccessful, the RAID management system will next attempt to locate an unused parity virtual block and migrate a mirror virtual block to parity. This frees up the mirror virtual block to receive the new data. If this second step fails, the RAID management system will then attempt to create an unused RAID area by migrating a number of mirror virtual blocks to parity using the reserved RAID areas. Since mirror virtual blocks occupy more physical storage space than parity virtual blocks, migration of mirror virtual blocks to parity RAID areas will result in a net increase in the amount of unused storage even if it requires conversion of a reserved RAID area to a parity RAID area. Migration of mirror blocks to parity will eventually result in an additional unused RAID area that can be converted to a mirror RAID area.

The creation/conversion protocol used to locate and establish mirror virtual blocks is advantageous because it permits the RAID management system to selectively adjust the memory allocation between parity and mirror areas according to the computer application. As applications vary, the RAID management system employs one or more of the above three techniques to define the ideal amount of mirror storage area for specific performance and reliability requirements of the various applications.

The RAID management system attempts to avoid the situation in which a storage request must wait for the space-making sequence to yield a mirror virtual block by creating unused RAID areas during idle time. However, in some situations, storage requests may be suspended during the space-making sequence. The RAID management system configures the virtual block storage space in such a way that the virtual space will be the same size or smaller than the available physical space 34. In this manner, the sequence of techniques will always yield an unused mirror block.

To migrate a mirror virtual block to a parity RAID area, the following sequence is employed:

1. The RAID management system chooses a mirror virtual block 52 to migrate according to a migration policy such as access recency or access frequency.
2. The RAID management system locates an unused virtual block 52 in a parity RAID area 44.
3. If such a block cannot be found, a reserved RAID area is converted to a parity RAID area according to the above described creation techniques.
4. New storage requests to the virtual block to be migrated are suspended.
5. The RAID management system waits until all active storage requests to the virtual block are completed.
6. Data is read from the mirror virtual block 52 into a temporary memory buffer.
7. The data is written to the chosen parity virtual block 53.
8. The virtual block table is modified to reference a new virtual block location.
9. Data requests are resumed.

The above two sequences are provided to give examples of how the memory system of this invention can operate. Other various procedures and alternatives are possible and would be recognized by one skilled in the art.

The memory system of this invention is advantageous because it affords high performance and high data availability (i.e., reliability), while providing a relatively low storage cost. This is accomplished by extracting the benefits associated with mirror storage and parity storage. The memory system further improves performance in access to mapped data by managing the mapping information between the various virtual storage spaces in a non-volatile RAM located external to the storage disk array.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A data memory system comprising:

a disk array having a plurality of disks;

a disk array controller coupled to the disk array for coordinating data transfer to and from the disks;

a RAID management system operatively coupled to the disk array controller for mapping mirror and parity RAID areas onto the disks, the RAID management system storing data in the mirror RAID area according to mirror redundancy and storing data in the parity RAID area according to parity redundancy, the RAID management system shifting data between the mirror and parity RAID areas on the disks in accordance with a defined performance protocol; and a memory map store external to the disk array and operatively coupled to the RAID management system for persistently storing mapping information used by the RAID management system to map the mirror and parity RAID areas onto the disks within the disk array.

2. A data memory system according to claim 1 wherein the memory map store is resident in the disk array controller.

3. A data memory system according to claim 1 wherein the memory map store redundantly stores the mapping information according to a selected reliability level.

4. A data memory system according to claim 1 wherein the memory map store comprises a non-volatile RAM.

5. A data memory system according to claim 1 wherein the memory map store comprises a battery-backed RAM.

6. A data memory system according to claim 1 wherein the disk array has a memory capacity ($DA_{cap}$) which is greater than a memory capacity of the memory map store ($MMS_{cap}$) according to the following relationship:

$$MMS_{cap} \text{ (Kilobytes)} = C \times DA_{cap} \text{ (Gigabytes)}$$

where C is a constant in a range of approximately 70 to 90.

7. A data memory system according to claim 1 wherein the mirror RAID area stores data according to RAID Level 1 and the parity RAID area stores data according to RAID Level 5.

8. A data memory system according to claim 1 wherein the performance protocol of the RAID management system is a migration policy selected from the group consisting of access recency and access frequency.

9. A data memory system comprising:

a disk array having a plurality of disks;

a disk array controller coupled to the disk array for coordinating data transfer to and from the disks;

a RAID management system operatively coupled to the disk array controller for mapping first and second RAID areas onto the disks, the RAID management system storing data in the first RAID area according to a first RAID level and storing data in the second RAID area according to a second RAID level, the RAID management system shifting data between the first and second RAID areas on the disks in accordance with a defined performance protocol;

an updatable memory map store external to the disk array, the memory map store maintaining mapping information used by the RAID management system to map the first and second RAID areas onto the disks; and the RAID management system dynamically altering the mapping of the first and second RAID areas on the disks and updating the mapping information in the memory map store to reflect the alteration.

10. A data memory system according to claim 9 wherein the memory map store redundantly stores the mapping information according to a selected reliability level.

11. A data memory system according to claim 9 wherein the memory map store comprises a battery-backed RAM.

12. A data memory system according to claim 9 wherein the disk array has a memory capacity ($DA_{cap}$) which is greater than a memory capacity of the memory map store ($MMS_{cap}$) according to the following relationship:

$$MMS_{cap} \text{ (Kilobytes)} = C \times DA_{cap} \text{ (Gigabytes)}$$

where C is a constant in a range of approximately 70 to 90.

13. A method for managing data on a disk array, comprising the following steps:

providing physical storage space on a disk array of plural disks;

mapping the physical storage space into a virtual storage space having mirror and parity RAID areas according to mapping information, the mirror RAID areas storing data according to mirror redundancy and the parity RAID areas storing data according to parity redundancy;

storing the memory information in a memory map store;

migrating data between the mirror and parity RAID areas to dynamically alter a configuration of the mirror and parity RAID areas; and updating the memory information in the memory map store to reflect the configuration of the mirror and parity RAID areas following said step of migrating data.

* * * * *